(12) United States Patent
Ahn et al.

(10) Patent No.: US 9,123,736 B2
(45) Date of Patent: Sep. 1, 2015

(54) SEMICONDUCTOR DEVICE AND METHOD OF MANUFACTURING THE SAME

(71) Applicant: SK hynix Inc., Icheon-si Gyeonggi-do (KR)

(72) Inventors: Jung Ryul Ahn, Namyangju-si (KR); Jum Soo Kim, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/564,761

(22) Filed: Dec. 9, 2014

(65) Prior Publication Data

US 2015/0093875 A1    Apr. 2, 2015

Related U.S. Application Data

(62) Division of application No. 13/596,393, filed on Aug. 28, 2012, now Pat. No. 8,937,344.

(30) Foreign Application Priority Data

Aug. 30, 2011    (KR) .......................... 10-2011-0087136

(51) Int. Cl.
| | | |
|---|---|---|
| H01L 21/02 | (2006.01) | |
| H01L 27/108 | (2006.01) | |
| H01L 49/02 | (2006.01) | |
| H01L 27/105 | (2006.01) | |
| H01L 27/115 | (2006.01) | |
| H01L 21/762 | (2006.01) | |
| H01L 21/768 | (2006.01) | |

(52) U.S. Cl.
CPC .......... *H01L 28/60* (2013.01); *H01L 21/76224* (2013.01); *H01L 21/76897* (2013.01); *H01L 27/105* (2013.01); *H01L 27/1052* (2013.01); *H01L 27/11529* (2013.01); *H01L 28/90* (2013.01)

(58) Field of Classification Search
CPC .............. H01L 21/02; H01L 21/76224; H01L 21/76897; H01L 27/105; H01L 27/108; H01L 27/1052; H01L 27/11529; H01L 28/60; H01L 28/90
See application file for complete search history.

(56) References Cited

U.S. PATENT DOCUMENTS

| | | | | |
|---|---|---|---|---|
| 2009/0014766 | A1* | 1/2009 | Kim ............................... | 257/298 |
| 2009/0140398 | A1* | 6/2009 | Jung ............................. | 257/638 |
| 2009/0142932 | A1* | 6/2009 | Jung ............................. | 438/736 |
| 2010/0190315 | A1* | 7/2010 | Shin et al. ..................... | 438/396 |
| 2012/0168905 | A1* | 7/2012 | Ryu .............................. | 257/534 |
| 2013/0154055 | A1* | 6/2013 | Park et al. ..................... | 257/532 |
| 2015/0001604 | A1* | 1/2015 | Kim .............................. | 257/300 |

* cited by examiner

*Primary Examiner* — Tan N Tran
*Assistant Examiner* — Fazli Erdem
(74) *Attorney, Agent, or Firm* — William Park & Associates Ltd.

(57) ABSTRACT

The semiconductor device includes a semiconductor substrate having a cell region and a peripheral circuit region defined therein, semiconductor memory elements formed over the semiconductor substrate in the cell region, an interlayer insulating layer formed over the semiconductor substrate in the peripheral circuit region, first conductive layers substantially vertically passing through the interlayer insulating layer, and arranged in a matrix, and second conductive layers coupling the first conductive layers in rows or columns, each pair of the second conductive layers and the first conductive layers coupled to the each pair of the second conductive layers, respectively, forming electrodes of a capacitor.

6 Claims, 6 Drawing Sheets

Peripheral circuit region

SEMICONDUCTOR DEVICE AND METHOD OF MANUFACTURING THE SAME

CROSS-REFERENCE TO RELATED APPLICATION

Priority is claimed to Korean patent application number 10-2011-0087136 filed on Aug. 30, 2011, the entire disclosure of which is incorporated herein by reference in its entirety.

BACKGROUND

1. Field of Invention

Various embodiments of the present invention generally relate to a semiconductor device and a method of manufacturing the same and, more particularly, to a semiconductor device having a low-capacitance capacitor and a method of manufacturing the same.

2. Description of Related Art

A semiconductor device includes a cell region for storing data and a peripheral circuit region for transferring a driving voltage. Memory cells, switching transistors and capacitors are provided in the cell region and the peripheral circuit region.

Capacitors are used to accumulate electric charge and are allocated to a predetermined region of a semiconductor device to achieve the necessary capacitance while the capacitors are coupled in series or parallel with each other. Since the existing memory device uses a capacitor having a predetermined area regardless of the capacitance of the device, a capacitor configured for a high-capacitance device is used rather than that for a low-capacitance device. However, since a capacitor configured for a high-capacitance device takes up much space to secure high capacitance, the capacitor takes up more space than necessary. As a result, unnecessary space is consumed in a semiconductor device that needs high integration, thereby reducing area efficiency.

BRIEF SUMMARY

Various embodiments generally relate to a reduction in area of a capacitor by forming a capacitor having a vertical structure in a peripheral circuit region at the same time as contact plugs and metal wires in a cell region.

A semiconductor device according to an embodiment includes a semiconductor substrate having a cell region and a peripheral circuit region defined therein, semiconductor memory elements formed over the semiconductor substrate in the cell region, an interlayer insulating layer formed over the semiconductor substrate in the peripheral circuit region, first conductive layers substantially vertically passing through the interlayer insulating layer, and arranged in a matrix, and second conductive layers coupling the first conductive layers in rows or columns, each pair of the second conductive layers and the first conductive layers coupled to the each pair of the second conductive layers, respectively, forming electrodes of a capacitor.

A semiconductor device according to an embodiment includes a semiconductor substrate having a cell region and a peripheral circuit region defined in substantially a first direction, gate lines formed over the semiconductor substrate in the cell region, spaced apart from each other in substantially a second direction substantially perpendicular to the first direction, and including drain select transistors, memory cells, and source select transistors, an interlayer insulating layer formed over the semiconductor substrate in the cell region and the peripheral circuit region to substantially cover the entirety of the gate lines, drain contact plugs provided within the interlayer insulating layer in the cell region, having substantially the same height as the interlayer insulating layer, extending substantially perpendicular to the semiconductor substrate, and arranged adjacent to the drain select transistors, respectively, bit lines spaced apart from each other substantially in the second direction on the interlayer insulating layer in the cell region and coming in contact with the drain select transistors, respectively, first conductive layers substantially having a pillar-like shape and arranged in a matrix within the interlayer insulating layer in the peripheral circuit region, and second conductive layers spaced apart from each other substantially in the second direction and commonly coupled to the first conductive layers arranged substantially in the first direction on the interlayer insulating layer in the peripheral circuit region, each pair of the second conductive layers and the first conductive layers coupled to the each pair of the second conductive layers, respectively, forming electrodes of a capacitor.

A method of manufacturing a semiconductor device according to an embodiment includes providing a semiconductor substrate having a cell region and a peripheral circuit region defined therein, forming gate lines spaced apart from each other over the semiconductor substrate in the cell region, forming an interlayer insulating layer over the semiconductor substrate to cover the entirety of the gate lines, forming first contact holes spaced apart from each other in the cell region and second contact holes arranged in a matrix in the peripheral circuit region by etching a portion of the interlayer insulating layer, forming contact plugs in the cell region and first conductive layers having substantially a pillar-like shape in the peripheral circuit region by filling the first and second contact holes with a conductive material, and forming and coupling second conductive layers having metal wires coming in contact with the contact plugs, respectively, in the cell region and the first conductive layers in the peripheral circuit region in rows or columns, and forming a capacitor having electrodes having each pair of the second conductive layers and the first conductive layers coupled to the each pair of the second conductive layers, respectively.

DETAILED DESCRIPTION

Hereinafter, various embodiments of the present disclosure will be described in detail with reference to the accompanying drawings. The figures are provided to allow those having ordinary skill in the art to understand the scope of the embodiments of the disclosure. Additionally, the same reference numerals or the same reference designators may denote the same elements throughout the specification.

FIGS. 1 to 11 are cross-sectional views illustrating a method of manufacturing a semiconductor device according to an embodiment.

Figure 1:
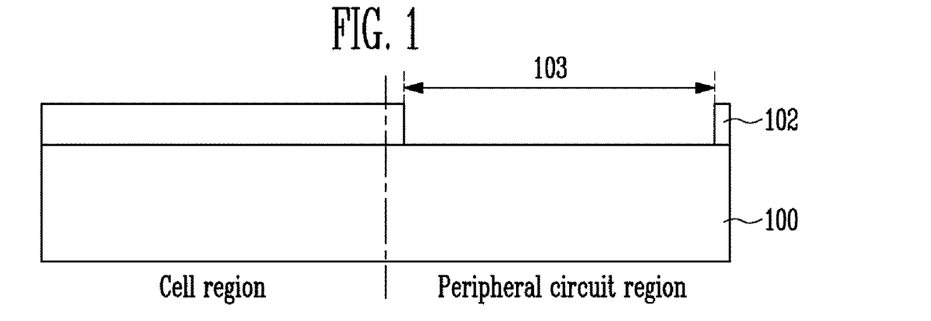
FIGS. 1 to 11 are cross-sectional views illustrating a method of manufacturing a semiconductor device according to an embodiment.

Referring to FIG. 1, a first hard mask 102 that has an opening in which a capacitor will be formed may be formed over a semiconductor substrate 100 that has a cell region and a peripheral circuit region defined in a first direction. Specifically, an opening 103 of the first hard mask 102 may be formed in part of the peripheral circuit region in which a capacitor will be formed.

Figure 2:
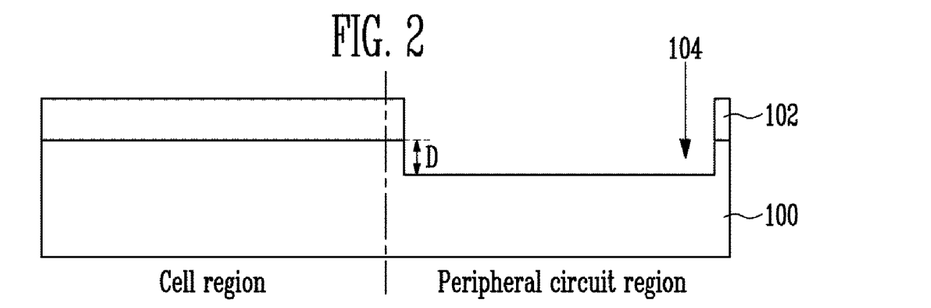

Referring to FIG. 2, an etch process using the first hard mask 102 as an etch mask may be performed to form a trench 104 having a predetermined depth D in the peripheral circuit region. In addition, the trench 104 may have a predetermined area according to an area of a capacitor to be formed. Preferably, the trench 104 may have such a large thickness that an insulating material with which the trench 104 is filled can block current from flowing through the semiconductor substrate 100.

Figure 3:
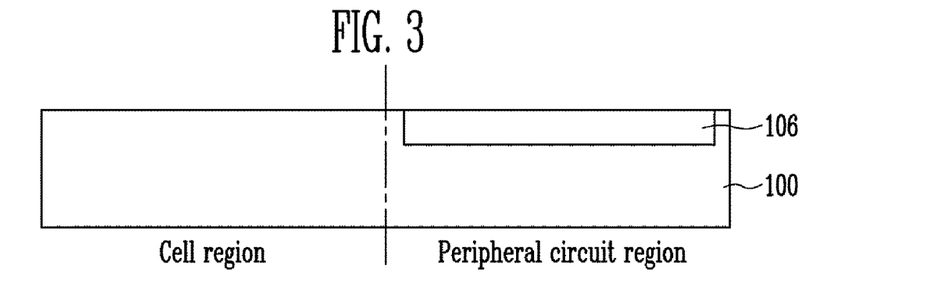

Referring to FIG. 3, the trench 104 may be filled with a block layer 106. The block layer 106 may be formed of an insulating material, for example, an oxide layer. The trench 104 may be filled with the block layer 106 by using various methods. For example, after an insulating material for the block layer 106 is formed over an entire structure having the trench 104 and the first hard mask 102 formed thereon, a planarization process may be performed until the semiconductor substrate 100 is exposed. Alternatively, after the first hard mask 102 is removed, an insulating material for the block layer 106 may be formed on top of the semiconductor substrate 100 such that the trench 104 may be filled with the insulating material. Subsequently, an etch process may be performed until the semiconductor substrate in regions other than a capacitor region are exposed.

Additionally, the height of the block layer 106 may vary according to capacitance. Also, the height of the block layer 106 may be in inverse proportion to a height of a lower electrode to be formed subsequently, whereas the height of the lower electrode may be in proportion to capacitance. That is, the greater the height of the block layer 106, the greater the height of the lower electrode to be formed subsequently. The smaller the height of the lower electrode, the greater the capacitance. In addition, the insulating material for the block layer 106 may be formed on the semiconductor substrate in the peripheral circuit region without forming the trench 104 in the semiconductor substrate in the peripheral circuit region.

Figure 4:
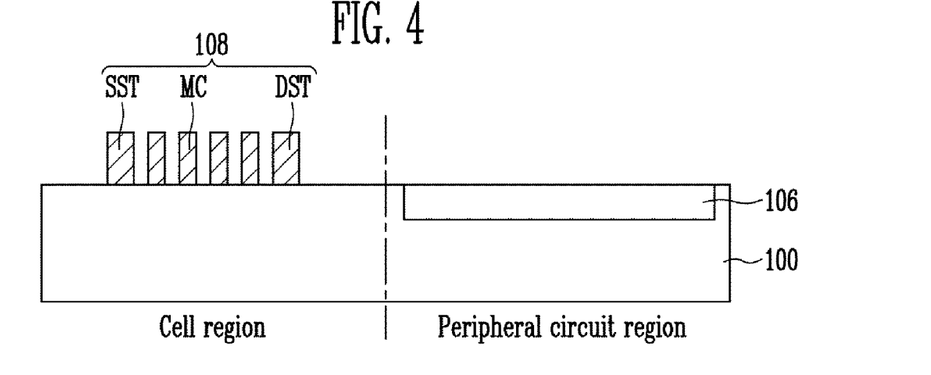

With reference to FIG. 4, gate patterns 108 that are spaced apart from each other in the first direction may be formed on the semiconductor substrate 100 in the cell region. Additionally, the gate patterns 108 may include a source select transistor SST, memory cells MC, and a drain select transistor DST. The transistor SST, memory cells MC, and a drain select transistor DST etc., may be generally referred to as semiconductor memory elements. Though not illustrated in the cross-sectional view of FIG. 4, the gate patterns 108 form gate lines that are separated from each other in a second direction substantially perpendicular to the first direction.

Figure 5:
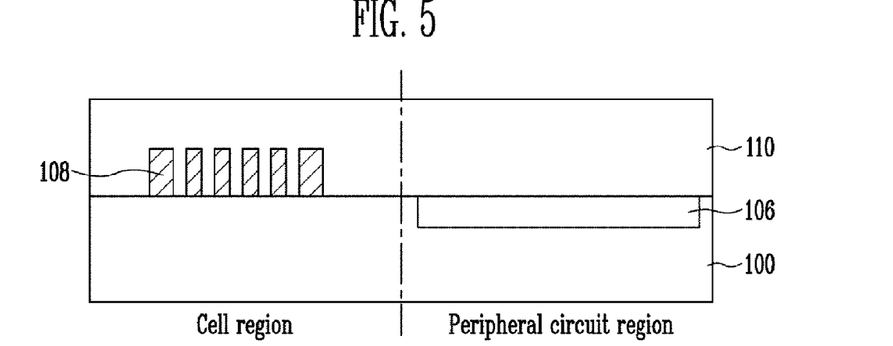

With reference to FIG. 5, a first interlayer insulating layer 110 may be formed over the entire structure having the gate patterns 108 and the block layer 106 formed thereon. Preferably, the first interlayer insulating layer 110 may be formed to completely cover the gate patterns 108 and may be formed of an oxide layer.

Figure 6:
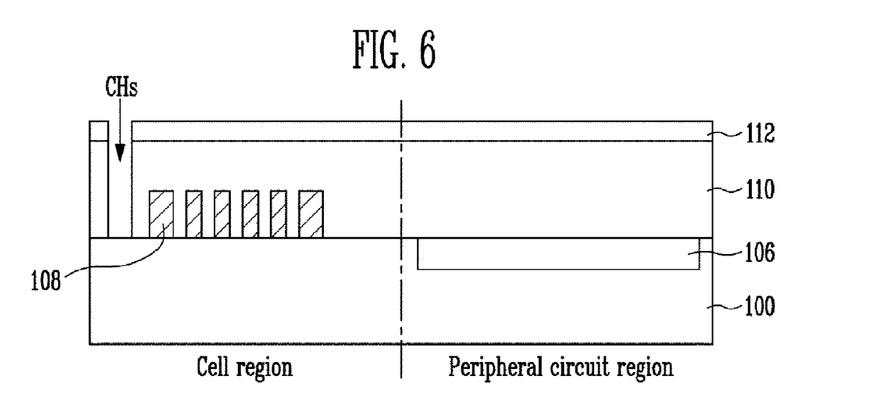

Referring to FIG. 6, a second hard mask 112 that has an opening in a source contact hole $CH_S$ region may be formed over the first interlayer insulating layer 110. For example, the opening of the second hard mask 112 may be formed in a region adjacent to the source select transistor (SST in FIG. 4) among the gate patterns 108. An etch process using the second hard mask 112 as an etch mask may be performed to thereby form the source contact hole $CH_S$ that exposes a portion of the semiconductor substrate in the cell region.

Figure 7:
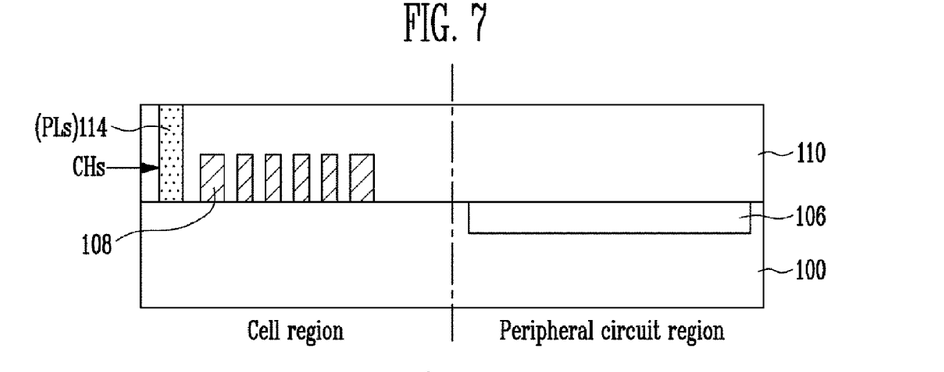

Referring to FIG. 7, after the second hard mask 112 is removed, the source contact hole $CH_S$ may be filled with a conductive material 114 to thereby form a source contact line $PL_S$. The conductive material 114 may be formed of tungsten, tungsten silicide, copper, or aluminum etc.

Figure 8:
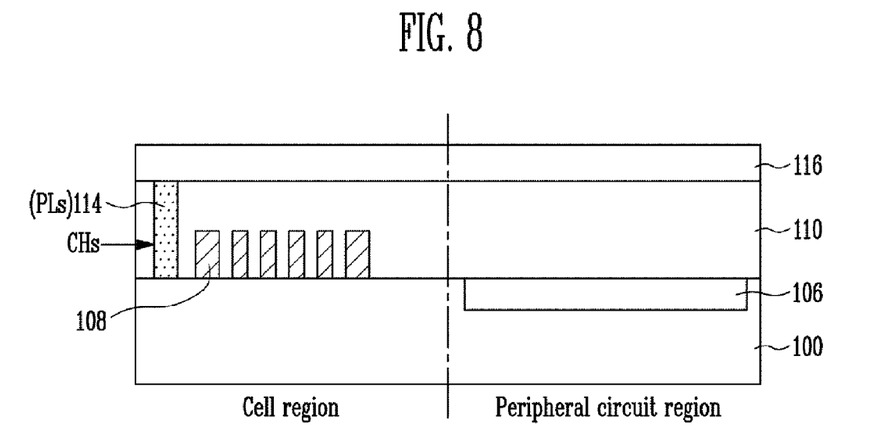

Referring to FIG. 8, the second interlayer insulating layer 116 may be formed over the first interlayer insulating layer 110 and the source contact line $PL_S$. Preferably, the second interlayer insulating layer 116 may be formed of an oxide layer.

Figure 9:
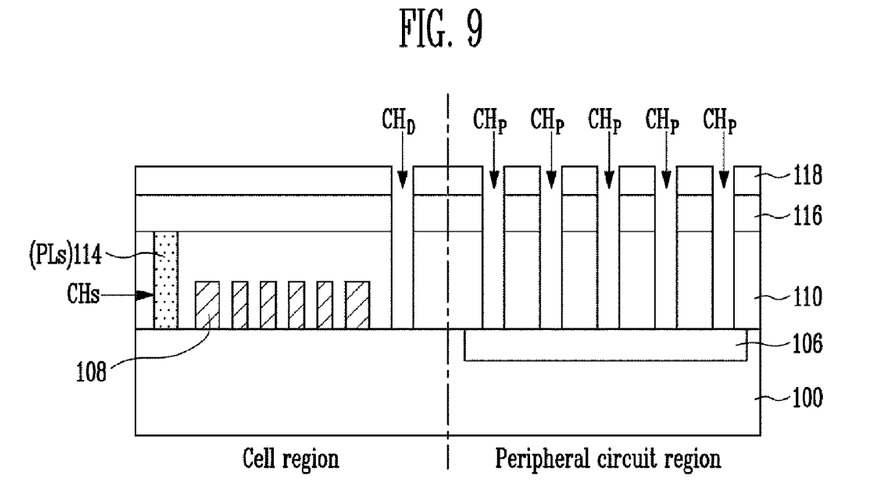

Referring to FIG. 9, a third hard mask 118 may be formed over the second interlayer insulating layer 116 to form a drain contact hole $CH_D$ and contact holes $CH_P$ for forming electrodes of a capacitor. Additionally, the third hard mask 118 has an opening that forms the drain contact hole $CH_D$ in the cell region and openings that form the contact holes $CH_P$ for lower electrodes in the peripheral circuit region. The drain contact hole $CH_D$ may be formed adjacent to the drain select transistor (DST in FIG. 4) in the cell region, whereas the contact holes $CH_P$ may be spaced apart from each other in the first direction in the peripheral circuit region. In addition, though not illustrated in the cross-sectional view of FIG. 9, the contact holes $CH_P$ may also be spaced apart from each other in the second direction substantially perpendicular to the first direction. That is, the contact holes $CH_P$ may be arranged in a matrix. This will be described further in connection with a three-dimensional view of FIG. 12 below. The contact holes $CH_P$ may be formed to expose the block layer 106 formed in the peripheral circuit region.

Figure 10:
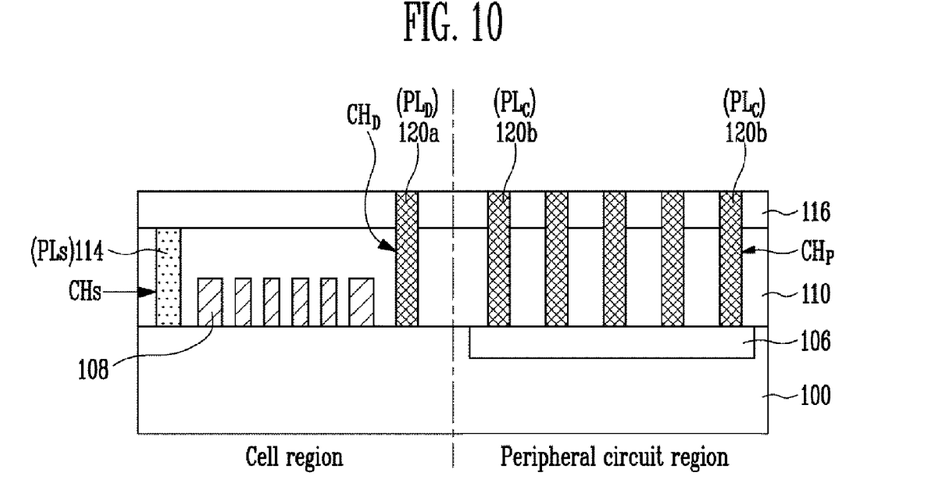

Referring to FIG. 10, the drain contact hole $CH_D$ and the contact holes $CH_P$ are filled with a first conductive layers 120a and 120b, respectively, so that a drain contact plug $PL_D$ may be formed in the cell region and electrodes $PL_C$ substantially having a pillar-like shape are formed in the peripheral circuit region. The first conductive layers 120a and 120b may be formed of tungsten, tungsten silicide, copper or aluminum etc. Subsequently, a planarization process may be performed until the second interlayer insulating layer 116 is exposed.

Figure 11:
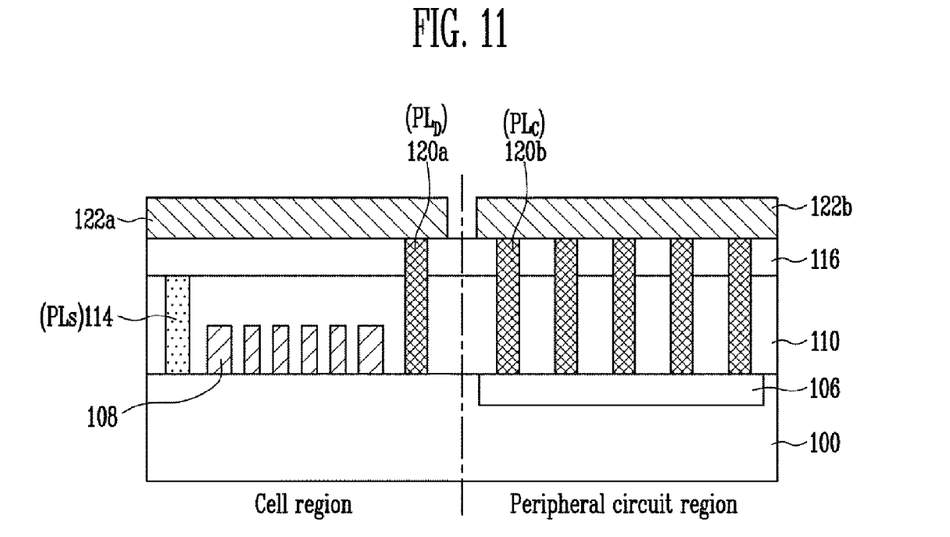

Referring to FIG. 11, second conductive layers 122a and 122b for metal wires may be formed over the second interlayer insulating layer 116, the drain contact plug $PL_D$, and the electrodes $PL_S$. Preferably, the second conductive layers 122a and 122b may be formed of a low-resistance metal material, for example, copper or aluminum. The second conductive layer 122a formed in the cell region becomes a metal wire for a bit line, whereas the second conductive layer 122b formed in the peripheral circuit region become an electrode of a capacitor. Additionally, during a patterning process performed after the second conductive layers 122a and 122b for metal wires may be formed over the second interlayer insulating layer 116, the drain contact plug $PL_D$, and the electrodes $PL_C$, though not illustrated in the cross-sectional view of FIG. 11, the plurality of electrodes $PL_C$ spaced apart from each other in the second direction substantially perpendicular to the first direction are formed in the capacitor region. This will now be described in detail with reference to the following three-dimensional view.

Figure 12:
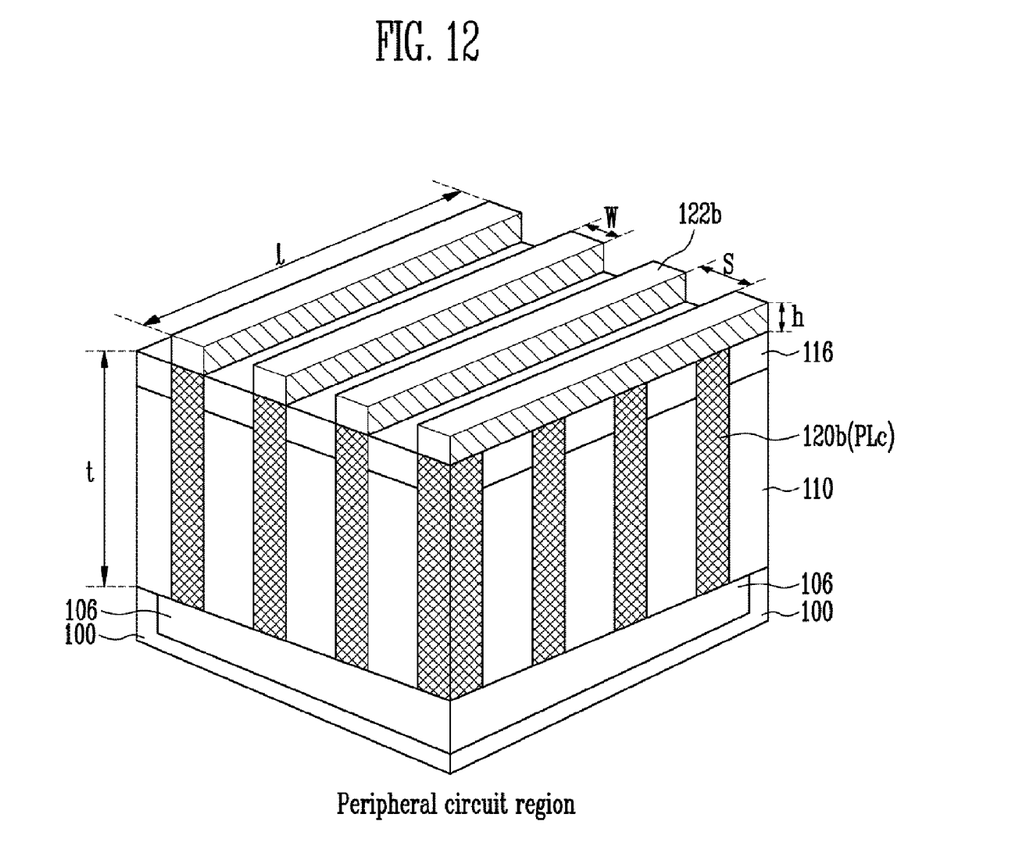
FIG. 12 is a three-dimensional view of a capacitor according an embodiment.

FIG. 12 is a three-dimensional view of a capacitor according to an embodiment.

Referring to FIG. 12, the capacitor may include the plurality of electrodes $PL_C$ formed within the first and second interlayer insulating layers 110 and 116, respectively, in the peripheral circuit region and spaced apart from each other in a matrix format; and the plurality of second conductive layers 122b formed over the second interlayer insulating layer 116 in the peripheral circuit region, spaced apart in the second direction, and coming in contact with the electrodes $PL_C$ spaced apart in the first direction. In order to use the electrodes $PL_C$ and the second conductive layers 122*b* as a capacitor, a pair of second conductive layers 122*b* adjacent to each other need to be coupled to different electrodes. That is, first electrodes may be coupled to even-numbered second conductive layers 122*b*, and second electrodes may be coupled to odd-numbered second conductive layers 122*b*, thereby forming a capacitor that has a three-dimensional structure formed of the even-numbered second conductive layer 122*b* coupled to the first electrodes and the electrodes $PL_C$ coupled thereto, and the odd-numbered second conductive layer 122*b* coupled to the second electrodes, and the electrodes $PL_C$ coupled thereto. Therefore, the capacitance of the capacitor may be determined by width W, space S, length l, and height h of the second conductive layers 122*b*, and width W and depth t of the electrodes $PL_C$. In addition, the capacitance may vary depending on the position of the electrodes $PL_C$. Capacitors having different capacitances according to the position of the electrodes $PL_C$ will now be described below with reference to the following drawings.

Figure 13:
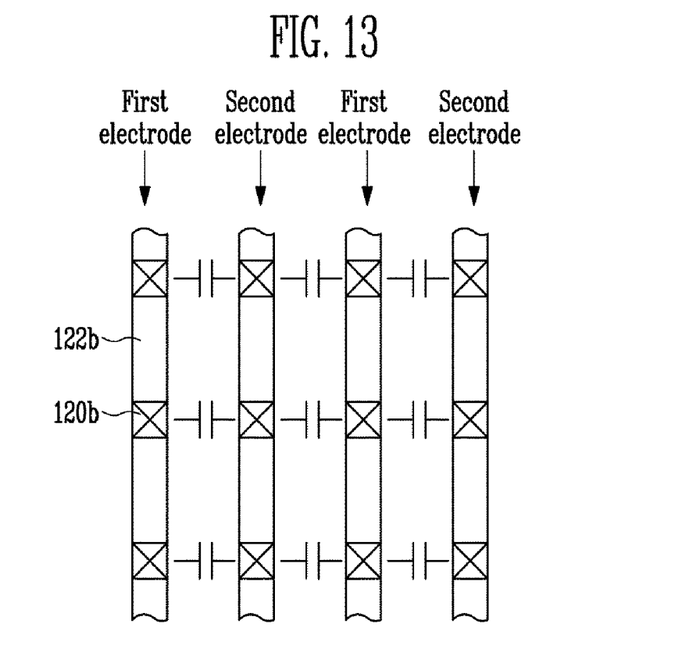
FIG. 13 is a plan view of a capacitor according to an embodiment.

FIG. 13 is a plan view of a capacitor according to an embodiment.

Referring to FIGS. 12 and 13, in the case of a capacitor that has the electrodes $PL_C$ spaced apart from each other in alignment with the second direction, capacitance C occurs between the electrodes $PL_C$ adjacent in alignment with the second direction and coupled to different electrodes. The capacitance C is calculated according to Equation 1 as follows:

$$C = \epsilon \frac{A}{s} \quad \text{[Equation 1]}$$

Referring to Equation 1, C is the capacitance, $\epsilon$ is the dielectric constant, A is the surface area, and s is the space between electrodes. In the capacitor illustrated in FIG. 13, A satisfies $(l \times h)+(n \times t \times c)$, where n is the number of electrodes $PL_C$, and c is the area of a single electrode $PL_C$. Therefore, the capacitance C of the capacitor, illustrated in FIG. 13, can be calculated according to Equation 2 as follows:

$$C = \epsilon \frac{(l \times h) + (n \times t \times c)}{s} \quad \text{[Equation 2]}$$

Referring to Equation 2, the capacitance C is in proportion to $(l \times h)+(n \times t \times c)$. Therefore, even when the area of the capacitor is reduced by decreasing the area $(l \times h)$, a value $(n \times t \times c)$ determined by height and number of lower electrodes is increased to thereby ensure the capacitance C of sufficient magnitude. That is, the total area of the semiconductor device can be reduced by decreasing the area of the capacitor disposed therein while capacitance of sufficient magnitude is ensured.

Figure 14:
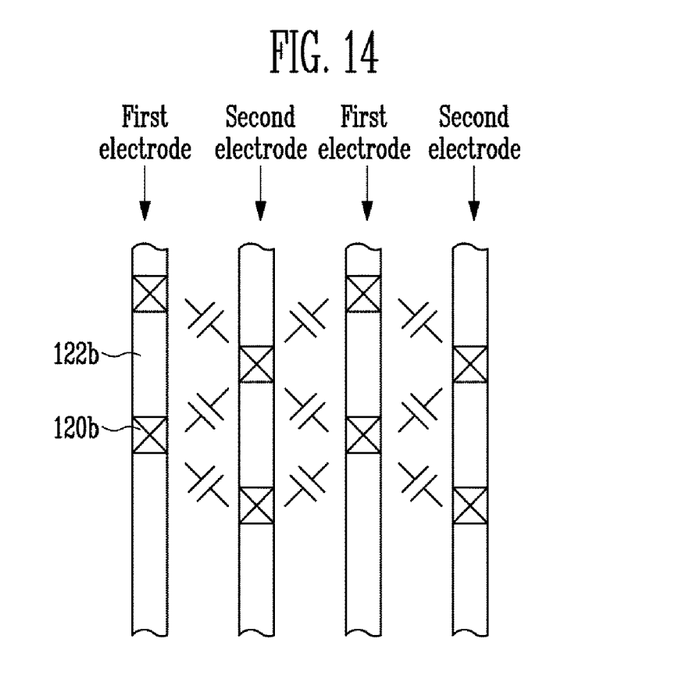
FIG. 14 is a plan view of a capacitor according to an embodiment.

FIG. 14 is a plan view of a capacitor according to an embodiment.

Referring to FIGS. 14 and 12, in the case of a capacitor in which the electrodes $PL_C$ are not arranged in alignment with the second direction and are spaced apart in substantially a zigzag manner on the second conductive layers 122*b*, the capacitance C occurs between one electrodes $PL_C$ coupled to the first electrode and two electrodes $PL_C$ coupled to the second electrodes. Since the capacitance of the capacitor satisfies Equation 1 as described above, the capacitance C of the capacitor as illustrated in FIG. 14 can be calculated according to Equation 3 as follows:

$$C = \epsilon \times \{(l \times h)+(2^2 \times n \times t \times c)\} \quad \text{[Equation 3]}$$

Referring to Equation 3, the capacitance C is in proportion to $(l \times h)+(2^2 \times n \times t \times c)$. Therefore, even when the area of the capacitor is reduced by decreasing the area $(l \times h)$, a value $(2^2 \times n \times t \times c)$ determined by height and number of lower electrodes is increased to thereby ensure the capacitance C of sufficient magnitude. That is, the total area of the semiconductor device can be reduced by reducing the area of the capacitor disposed therein while capacitance of sufficient magnitude is ensured.

In addition to the capacitors having the structures as illustrated in FIGS. 13 and 14, capacitors having the capacitance C with various magnitudes can be realized by changing the positions of the electrodes $PL_C$ and the second conductive layers 122*b*.

According to embodiments of the present invention, a capacitor may be formed in a peripheral circuit region at the same time as contact plugs and metal wires in a cell region, thereby forming a capacitor that has a small area and ensures capacitance of sufficient magnitude without performing an additional process.

What is claimed is:

1. A method of manufacturing a semiconductor device, the method comprising:
   providing a semiconductor substrate having a cell region and a peripheral circuit region defined therein;
   forming gate lines spaced apart from each other over the semiconductor substrate in the cell region;
   forming an interlayer insulating layer over the semiconductor substrate to cover the entirety of the gate lines;
   forming first contact holes spaced apart from each other in the cell region and second contact holes arranged in a matrix in the peripheral circuit region by etching a portion of the interlayer insulating layer;
   forming contact plugs in the cell region and first conductive layers having substantially a pillar-like shape in the peripheral circuit region by filling the first and second contact holes with a conductive material; and
   forming and coupling second conductive layers having metal wires coming in contact with the contact plugs, respectively, in the cell region and the first conductive layers in the peripheral circuit region in rows or columns, and forming a capacitor having electrodes having each pair of the second conductive layers and the first conductive layers coupled to the each pair of the second conductive layers, respectively.

2. The method of claim 1, further comprising, before the forming of the gate lines:
   forming a trench by etching a portion of the semiconductor substrate in the peripheral circuit region; and
   forming a block layer by filling the trench with an insulating material.

3. The method of claim 2, wherein the block layer is formed of an oxide layer.

4. The method of claim 1, wherein the first and second contact holes are formed at substantially the same time by performing an etch process in the cell region and the peripheral circuit region.

5. The method of claim 1, wherein the metal wires and the second conductive layers are formed at substantially the same time in the cell region and the peripheral circuit region.

6. The method of claim 1, wherein first electrodes are coupled to even-numbered conductive layers among the second conductive layers, and second electrodes different from the first electrodes are coupled to odd-numbered conductive layers.

* * * * *